United States Patent [19]

Suzuki

[11] Patent Number: 5,212,835
[45] Date of Patent: May 18, 1993

US005212835A

[54] FREQUENCY-CONVERSION MIXER

[75] Inventor: Eiji Suzuki, Kawasaki, Japan

[73] Assignee: Kokan Densetsu Kogyo Kabushiki Kaisha, Kanagawa, Japan

[21] Appl. No.: 554,731

[22] Filed: Jul. 18, 1990

[51] Int. Cl.$^5$ .............................................. H04B 1/26
[52] U.S. Cl. .................................... 455/330; 455/333; 307/529
[58] Field of Search ................. 455/118, 313, 317–319, 455/323, 326, 330, 333; 358/186, 191.1, 195.1; 332/176, 177; 307/529

[56] References Cited

U.S. PATENT DOCUMENTS 4,245,355  1/1981  Pascoe et al. ...................... 455/330

FOREIGN PATENT DOCUMENTS 51-82357  1/1978  Japan .................................. 455/330

OTHER PUBLICATIONS

Heller, S. "Transitorized Mixer Circuit", *RCA Technical Notes;* Jan. 9, 1961, pp. 1–2.

*Primary Examiner*—Reinhard J. Eisenzopf
*Assistant Examiner*—Andrew Faile
*Attorney, Agent, or Firm*—Ladas & Parry

[57]  ABSTRACT

A frequency-conversion mixer, which is designed to operate in substantially the whole range of the radio frequency band extending from low frequency to the ultra-high frequency, has first and second diodes inversely arranged in parallel connection between a first input terminal for a receiving signal and a junction point. Third and fourth diodes are connected in forward series between a common terminal and a second input terminal for an oscillator signal with the junction point between the third and fourth diodes. A dc component removing capacitor is connected to the junction point for providing a frequency mixed signal, whereby the use of a transformer as used in a double balanced mixer is eliminated and there is practically no output response at frequencies below the cutoff frequency of the diodes.

15 Claims, 3 Drawing Sheets

FREQUENCY-CONVERSION MIXER

BACKGROUND OF THE INVENTION

The present invention relates to a frequency-conversion mixer and more particularly to a frequency-conversion mixer which operates within substantially the whole range of the radio frequency band extending from long wave or low-frequency to ultra-high-frequency.

The frequency-conversion mixers heretofore used in superheterodyne receivers, transverter transmitters, etc., have included vacuum-tube mixers, transistor mixers, diode mixers, double balanced mixers, etc.

The vacuum-tube mixers have consisted of a triode, pentode or heptode and have had the disadvantages of causing conversion noise inherent to the mixer, producing a greater loss than the diode mixers at frequencies higher than an upper-limit frequency of several hundreds MHz due to the construction and size of the electrodes of the vacuum tube and requiring a very critical coupling between the mixer and the local oscillator. In any event, vacuum-tube mixers have come out of use along with the development of transistors.

Transistor mixers have substantially the same electric performance as vacuum-tube mixers but even somewhat greater conversion noise. In addition, while mixers employing field-effect transistors have been improved more or less in cross modulation distortion characteristic as compared with other transistor mixers, they still have substantially the same conversion loss as vacuum-tube mixers.

Referring now to FIG. 7, there is shown a type of the diode mixers which has been used in ordinary transmitters, radars, etc., involving frequencies higher than the ultra-high frequency band. A signal R of a frequency $f_1$, which has been received through a tuning circuit 1, is coupled with a local-oscillator signal OSC of a frequency, mixed by a diode 2 and outputted as an intermediate frequency signal IF of a frequency $f_1+f_2$ or $|f_1-f_2|$ through a tuning circuit 3. Such diode mixers have large conversion loss and, frequently, coupling loss due to the inevitable use of magnetic coupling from the tuning circuit and thus restrictions are imposed on obtaining the best coupling.

Also, FIG. 8 shows a circuit diagram of the double balanced mixer. The double balanced mixer includes 4 diodes $D_1$, $D_2$, $D_3$ and $D_4$ which are connected in a ring form so that, when a received signal R is applied via an input-output transformer $T_1$ and also a local-oscillator signal OSC is applied between the secondary side of the input-output transformer $T_1$ and the primary side of an input-output transformer $T_2$, an intermediate frequency signal IF of a frequency $f_1+f_2$ or $|f_1-f_2|$ is generated through the input-output transformer $T_2$.

The double balanced mixer has been designed so that the local-oscillator signal OSC does not leak from the mixer circuit. As a result, the cross modulation distortion characteristic is excellent as compared with the vacuum mixer, the transistor mixer and the diode mixer. In addition, the coupled circuit can be coupled directly at X. Presently, therefore, it is the best mixer.

As another result, if the circuit design of a double balanced mixer is proper, the mixer circuit itself operates positively and no adjustment is required. Thus, the double balanced mixer is used in a variety of circuits.

However, double balanced mixers have the disadvantage that the electric characteristics are largely dependent on the characteristics of the component parts such as the diodes and the transformers thus requiring the careful selection of component parts depending on the frequency band used.

Also, it has been required that the output of the local-oscillator signal is between 10 and 30 dbm. There has been another disadvantage that there are instances where the output of the local-oscillator signal corresponds to the transmitted output in microwave and therefore a high cost is required just by the circuit for generating the local-oscillator signal.

Further, the double balanced mixers have been disadvantageous in that they are highest in conversion loss as compared with the mixers of the other types thus requiring the provision of an amplifier on the output side.

SUMMARY OF THE INVENTION

The present invention has been made with a view to overcoming the foregoing deficiencies in the prior art, and it is an object of the present invention to provide a frequency-conversion mixer which can be used in either of concentrated constant circuits and distributed constant circuits and is capable of reversible conversion.

To accomplish the above object, in accordance with the present invention there is thus provided a frequency conversion mixer comprising input means including first and second diodes which are in inverse-parallel connection with each other to receive a signal of a first frequency, detecting means including third and fourth diodes which are in inverse-series connection with each other to non-linearly detect a signal of a second frequency, and a dc component removing capacitor connected to the output side of the input means and the junction point of the third and fourth diodes.

When the signal of the first frequency is applied to the input means and the signal of the second frequency is applied to the detecting means, a signal of a frequency representing the sum or the difference between the first and second frequencies is generated through the dc component removing capacitor.

Thus, there is the effect of providing a frequency-conversion mixer which eliminates the use of such transformers as used in the double balanced mixer and which practically has no output response at frequencies below the cutoff frequency of the diodes.

Also, there is the effect of providing a frequency-conversion mixer in which each pair of reverse connected diodes functions as a coupling capacitor of the proper capacitance thus practically eliminating the attenuation of signals and ensuring the reduced passing loss of signals.

The above and other objects as well as advantageous features of the invention will become more clear from the following description taken in conjunction with the drawings.

DETAILED DESCRIPTION OF THE PREFERRED EMBODIMENTS

An embodiment of the present invention will now be described in detail with reference to the accompanying drawings.

Figure 1:
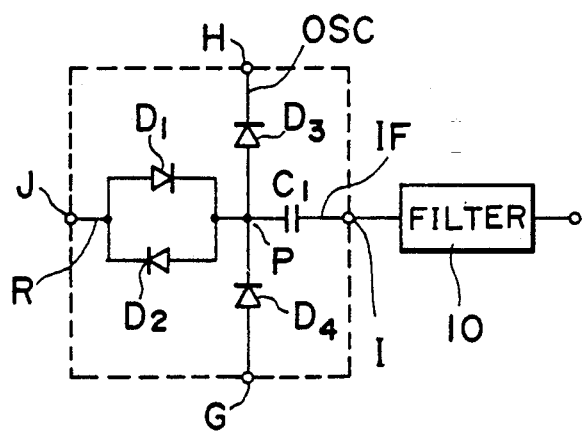
FIG. 1 is a circuit diagram of a frequency-conversion mixer according to an embodiment of the present invention.

FIG. 1 is a circuit diagram of a frequency-conversion mixer according to an embodiment of the present invention. In FIG. 1 (and FIGS. 2 to 6), symbol J designates an input terminal to which is applied a received or receiving signal R of a frequency $f_1$, H an input terminal to which is applied a local-oscillator signal OSC of a frequency $f_2$, G, a common terminal (usually connected to ground), I, an output terminal for providing an intermediate frequency signal IF of the frequencies $f_1$, $f_2$, $f_1+f_2$ and $|f_1-f_2|$, $D_1$, $D_2$, $D_3$ and $D_4$, diodes, and $C_1$, a capacitor for dc component removing purposes.

Figure 2:
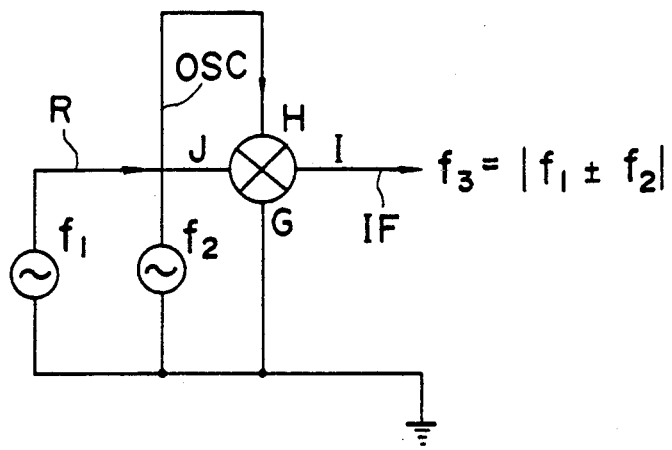
FIG. 2 is a schematic diagram useful for explaining the input-output relation of the frequency-conversion mixer shown in FIG. 1.
Figure 3:
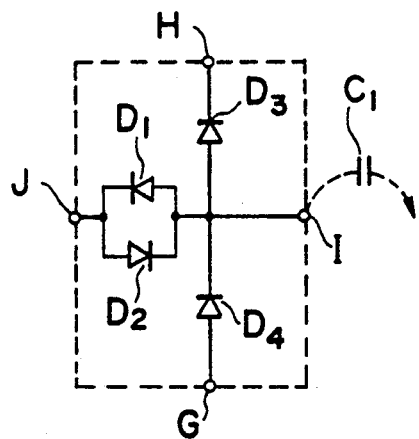
FIG. 3 is a circuit diagram of a frequency conversion mixer according to another embodiment of the present invention.

FIG. 2 shows the relation between the input and output signals in the frequency-conversion mixer shown in FIG. 1. In other words, when the receiving signal R is applied to the terminal J and the local-oscillator signal OSC is applied to the terminal H, the intermediate frequency signal IF is produced from the terminal I.

Next, the operation of the frequency-conversion mixer shown in FIG. 1 will be described.

In the first place, the local-oscillator signal OSC applied to the input terminal H is subjected to non-linear detection by the diodes $D_3$ and $D_4$, which are connected in forward series from the common terminal G to the input terminal H. At this time, the potential at a junction point P between the diodes $D_3$ and $D_4$ is maintained substantially at a value which is ½ of the local-oscillator signal OSC by the diodes $D_3$ and $D_4$.

The receiving signal R applied to the input terminal J is mixed with the local-oscillator signal OSC at the point P through the diodes $D_1$ and $D_2$. It is to be noted that the level of the local-oscillator signal OSC is sufficient even if it is below 0 dbm.

Further, it is well known that the application of signals of different frequencies to diodes or non-linear detecting elements results in the production of signals of the sum and difference frequencies. This will not be described further, therefore.

The application of a reverse voltage produces a capacitance component between the cathode and anode of a diode. In the case of the diodes $D_1$ and $D_2$, which are connected in parallel and inversely (oppositely) oriented with respect to each other between input terminal J and junction point P in the present embodiment, the capacitance is on the order of 0.2 to 1 pF. A capacitance of this order is an ideal value for a coupling capacitor in cases where the frequency $f_1$ is higher than 50 MHz. Therefore, the receiving signal R is not practically attenuated and its passing loss is extremely small.

As a result, the present invention has the effect of eliminating the occurrence of a phenomenon that the sensitivity of the ordinary diode mixer is deteriorated due to its dead zone to small signals and matching the impedance of an external circuit connected to the terminal J and the impedance of the point P.

The intermediate frequency signal IF generated from the point p has the frequency components of $f_1$, $f_2$, $f_1+f_2$ and $|f_1-f_2|$. The capacitor $C_1$ removes the dc component from the intermediate frequency signal IF and outputs it. Further, in order to obtain the desired frequency $f_1+f_2$ or $|f_1-f_2|$, a filter 10 for passing the desired frequency component is connected to the terminal I. In this case, a filter with a low impedance input is connected.

It is to be noted that while the frequency-conversion mixer according to the present embodiment incorporates the coupling capacitor $C_1$ to take the form of a one-chip IC, it may also be formed by assembling individual components.

Also, the mixer may take the form of a one-chip IC to which, as, for example, a coupling capacitor $C_1$ of below 50 MHz is externally attached.

Figure 4:
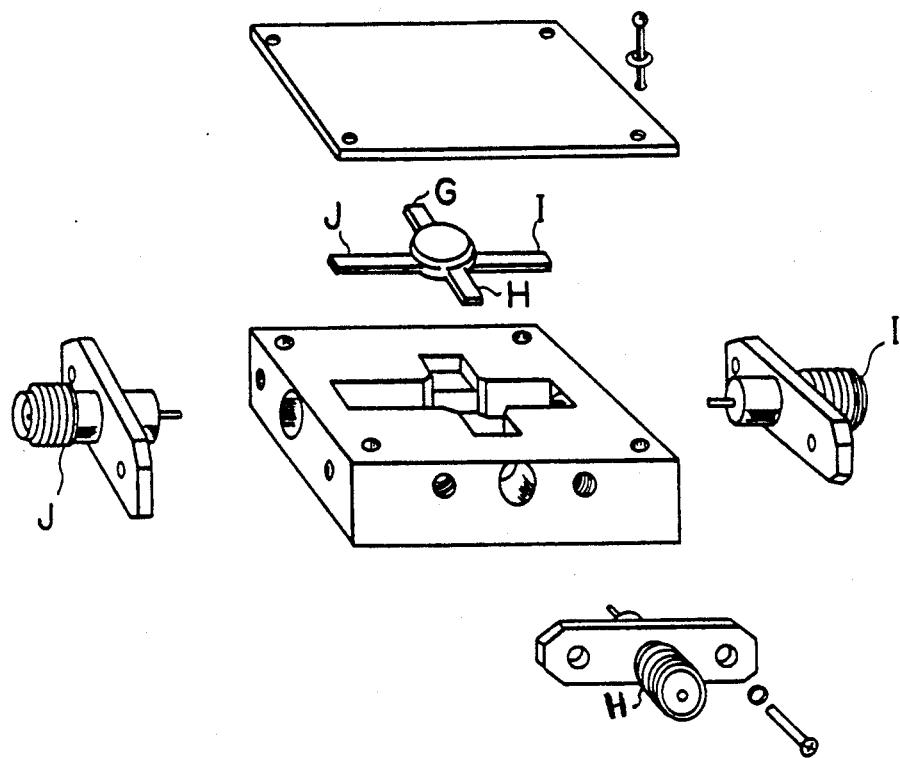
FIG. 4 is a perspective view of a frequency-conversion mixer of a modular construction.
Figure 5:
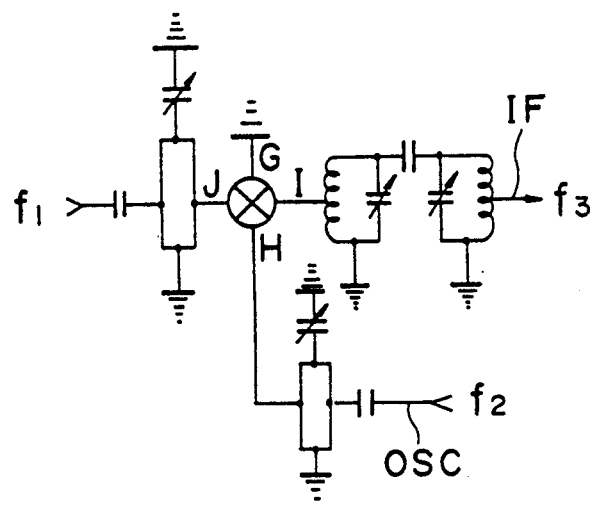
FIG. 5 is a circuit diagram of a receiver in which is mounted the frequency-conversion mixer shown in FIG. 1.

In addition, the one-chip IC frequency-conversion mixer may be of a modular construction as shown in FIG. 4. By assembling the mixer as a module, there is the effect of making easy its fitting in a receiver as shown in FIG. 5.

In this case, where it is desired to incorporate the mixer in a receiver of the type employing the conventional diode mixer or double balanced mixer, it can be incorporated as such in place of the diode mixer or the double balanced mixer and it can be directly coupled to the tuning circuits. Where the frequency-conversion mixer according to the present embodiment is mounted, the manufacturing cost of the mixer circuit on the whole is substantially the same as the diode mixer or it is reduced to 1/10 as compared with the double balanced mixer as a single unit in an X-band radar. Further, the outputs of the high frequency amplifier and the local oscillator circuit amplifying unit can be reduced to thereby reduce the cost to substantially about ⅔.

Figure 6:
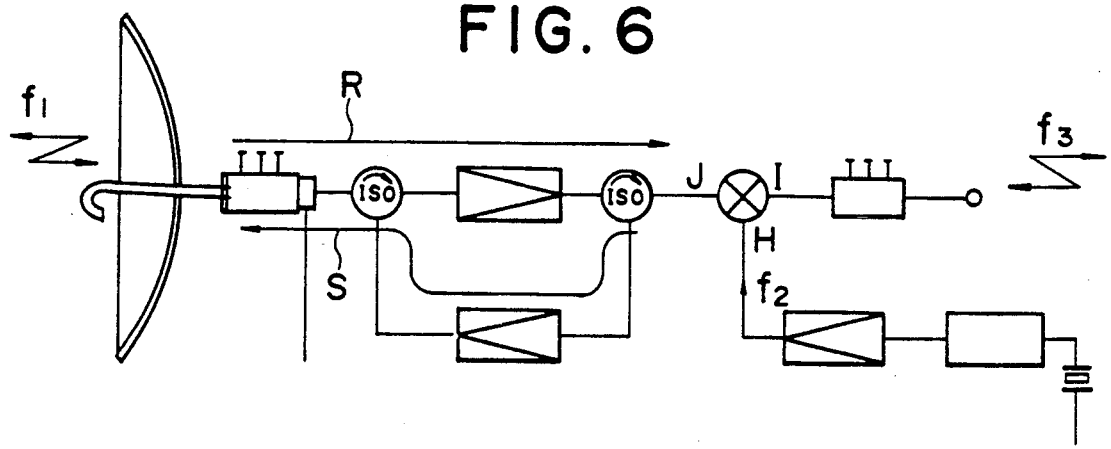
FIG. 6 is a circuit diagram of a reversible-conversion transmitting and receiving equipment in which is mounted the frequency-conversion mixer shown in FIG. 1.
Figure 7:
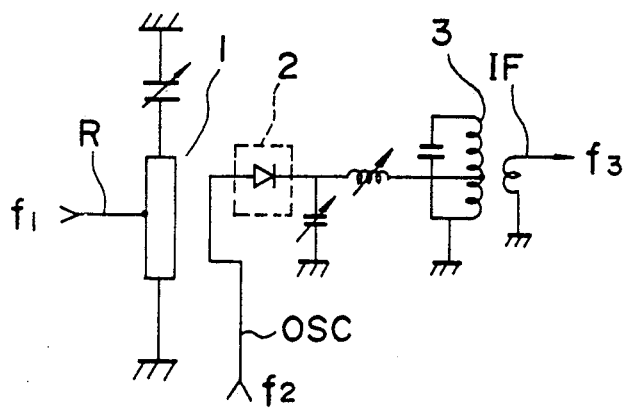
FIGS. 7 and 8 are circuit diagrams of conventional frequency-conversion mixers.
Figure 8:
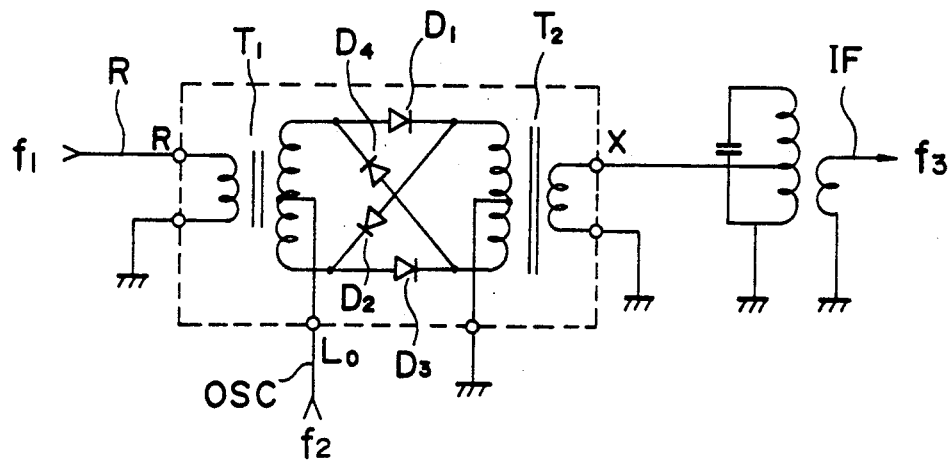

Still further, if a signal S of a frequency $f_3$ is applied to the terminal I instead of applying the receiving signal R of the frequency $f_1$ to the terminal J as shown in FIG. 6, a signal of a frequency $f_2 \pm f_3$ is generated from the terminal J. In other words, the reversible conversion is permitted between the terminals J and I and the mixer can be applied to a reversible-conversion transmitting and receiving equipment.

As mentioned previously, the frequency-conversion mixer in accordance with the present invention is small in size and low in conversion loss and requires no adjustment as compared with the conventional mixers such as the double balanced mixer requiring the use of input-output transformers.

It is to be noted that the frequency-conversion mixer according to the present invention can be used in a variety of equipment involving frequencies in the range of the low-frequency to the ultra-short frequency, e.g., as a satellite broadcasting receiver mixer, HF-SHF radio communication/transmitting and receiving mixer, microwave radar mixer, citizen's general radio, FM radio or television receiver mixer, spectrum analyzer mixer, heterodyne-type measuring instrument mixer, phase-locked loop oscillator mixer and phase discriminator.

What is claimed is:

1. A frequency-conversion mixer comprising:
   input means having a parallel circuit including a first and second diode arranged in inverse parallel connection with each other for inputting input signals from its one terminal;

detecting means having a series circuit including a third and fourth diode arranged in forward series connection, the other terminal of said parallel circuit being connected to the junction point of said third and fourth diode and local oscillating signals being supplied to one of said series circuit; and a capacitor of which one terminal is connected to said junction point, the frequency-converted signals being taken out from the other terminal.

2. A frequency-conversion mixer according to claim 1, wherein said input means and said detecting means are in the form of a one-chip IC.

3. A frequency-conversion mixer according to claim 1, wherein said input means, said detecting means and said capacitor are in the form of a one-chip IC.

4. A frequency-conversion mixer according to claim 1, wherein a signal of a first frequency is supplied to said input means, and a signal of a second frequency is supplied to said detecting means.

5. A frequency-conversion mixer according to claim 4, wherein a signal of a frequency corresponding to the difference and sum of said first and second frequencies is produced from an output terminal of said capacitor.

6. A frequency-conversion mixer according to claim 5, further comprising a filter connected to the output terminal of said capacitor to pass said signal of the frequency corresponding to the difference or sum of said first and second frequencies.

7. A frequency-conversion mixer according to claim 1, wherein a signal of a second frequency is supplied to said detecting means and a signal of a third frequency is supplied to an output side of said capacitor whereby a signal of frequency corresponding to the difference or sum of said second and third frequencies is produced from said input means.

8. A frequency-conversion mixer, comprising:

input means for providing a receiving signal of a first frequency, the input means having a first input terminal for receiving the receiving signal, a junction point, and first and second oppositely oriented diodes connected in parallel between the first input terminal and the junction point;

detecting means for providing a local-oscillator signal, the detecting means having a second input terminal for receiving the local-oscillator signal, a common terminal, and third and fourth diodes connected in forward series from the common terminal to the second input terminal with the junction point connected between the third and fourth diodes; and capacitive means for outputting a frequency-mixed signal from the junction point.

9. The frequency-conversion mixer according to claim 8, wherein the capacitive means comprises a capacitor having one terminal connected to the junction point and an opposite terminal for outputting the frequency-mixed signal.

10. The frequency-conversion mixer according to claim 8, wherein the common terminal is grounded.

11. The frequency-conversion mixer according to claim 9, wherein the common terminal is grounded.

12. The frequency-conversion mixer according to claim 8, and further comprising a filter for receiving the outputted frequency-mixed signal and providing a final signal of only some frequency or frequencies thereof.

13. The frequency-conversion mixer according to claim 9, and further comprising a filter for receiving the outputted frequency-mixed signal and providing a final signal of only some frequency or frequencies thereof.

14. The frequency-conversion mixer according to claim 10, and further comprising a filter for receiving the outputted frequency-mixed signal and providing a final signal of only some frequency or frequencies thereof.

15. The frequency-conversion mixer according to claim 11, and further comprising a filter for receiving the outputted frequency-mixed signal and providing a final signal of only some frequency or frequencies thereof.

* * * * *